US008564332B2

(12) United States Patent
Mathur

(10) Patent No.: US 8,564,332 B2
(45) Date of Patent: Oct. 22, 2013

(54) AUTOMATIC CLOCK-ACTIVITY BASED CHIP/IO RING DESIGN—A NOVEL ARCHITECTURE TO REDUCE STANDBY CONSUMPTION

(75) Inventor: Shiv Harit Mathur, Uttar Pradesh (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 13/187,284

(22) Filed: Jul. 20, 2011

(65) Prior Publication Data

US 2013/0021077 A1 Jan. 24, 2013

(51) Int. Cl.
*H03K 5/19* (2006.01)
(52) U.S. Cl.
USPC ............... 327/18; 327/20; 327/198
(58) Field of Classification Search
USPC ..................... 327/18, 20, 21, 198
See application file for complete search history.

(56) References Cited

U.S. PATENT DOCUMENTS

| 7,545,192 | B2 * | 6/2009 | Suh ............... | 327/198 |
|---|---|---|---|---|
| 7,831,851 | B2 * | 11/2010 | Yoshii ............ | 713/324 |
| 8,212,601 | B2 * | 7/2012 | Davis ............. | 327/291 |
| 2002/0070757 | A1 * | 6/2002 | La Rosa .......... | 326/83 |
| 2002/0145918 | A1 * | 10/2002 | Maayan et al. ..... | 365/189.07 |

OTHER PUBLICATIONS

G. Téllez, A. H. Farrahi, and M. Sarrafzadeh. "Activity-Driven Clock Design for Low Power Circuits," International Conference on Computer-Aided Design (ICAAD), 1995.

N. H. E. Weste and K. Eshraghian, Principles of CMOS VLSI Design: A Systems Perspective, 2nd Edition (Addison-Wesley Publishing Company, New York) 1993.
M. Pedram, "Power minimization in IC design: Principles and applications", ACM Transactions on Design Automation of Electronic Systems, vol. 1, No. 1 (1996), pp. 3-56.
F. Najm. "Transition Density: A New Measure of Activity in Digital Circuits". IEEE Transactions on Computer Aided Design, 12(2):310-323, 1993.
D. Maksimovic, V. C. Oklobdzija, B. Nikolic, et al., "Clocked CMOS adiabatic logic with integrated single-phase power-clock supply: Experimental results", in Proc. of Int. Symp. on Low-Power Electronics and Design, Monterey, pp. 323-327 (1997).
W. C. Oklobdzija, D. Maksimovic, F. Lin, "Pass-transistor adiabatic logic using single power-clock supply", IEEE Trans. on Circuits and Systems II: Analog and Digital Signal Processing, vol. 44, No. 10.
Y. Moon, D. K. Jeong, "An efficient charge recovery logic circuit" IEEE J. of Solid-state Circuits, vol. 31, No. 4, pp. 514-522 (1996).
S. Kim. M C. Papaefthymiou, "True single-phase-recovering logic for low-power, high-speed VLSI", in Proc. of Int. Symp. on Low-Power Electronics and Design, Monterey, pp. 167-172. 1998.
W. C. Athas, L. J. Svensson, J. G. Koller, et al., "Low-power digital systems based on adiabatic-switching principles", IEEE Trans. on VLSI Systems. vol. 2, No. 4 pp. 398-407, 1994.

\* cited by examiner

*Primary Examiner* — Lincoln Donovan
*Assistant Examiner* — Jung H. Kim
(74) *Attorney, Agent, or Firm* — Wolf, Greenfield & Sacks, P.C.

(57) ABSTRACT

A circuit including an input configured to receive a clock signal. Detection circuitry may be configured to detect if the clock signal is present on the input. An output is configured to provide a control signal having a first level if the clock signal is present on the input and a second level if the clock signal is absent from the input.

38 Claims, 7 Drawing Sheets

AUTOMATIC CLOCK-ACTIVITY BASED CHIP/IO RING DESIGN—A NOVEL ARCHITECTURE TO REDUCE STANDBY CONSUMPTION

BACKGROUND OF THE INVENTION

1. Field of the Invention

The present invention relates to circuits.

2. Discussion of the Related Art

Integrated circuits are used in a wide range of applications. For example, integrated circuits are commonly used in portable systems which are battery powered. In order to prolong battery life, it is desirable to minimize power consumption. In systems where integrated circuits are used and mains power is available, it is again desirable to minimize power consumption.

When an integrated circuit is active and functional, it utilizes power from its power supply in order to perform its desired function. When the functional feature of the integrated circuit is not required, the integrated circuit or part of the integrated circuit can be moved into a stand-by mode in order to save power.

SUMMARY OF THE INVENTION

In one embodiment, a circuit comprises an input configured to receive a clock signal detection circuitry configured to detect if said clock signal is present on said input; and an output configured to provide a control signal having a first level if said clock signal is present on said input and a second level if said clock signal is absent from said input.

The detection circuit may comprise an amplifier configured to amplify an input on said input.

The detection circuit may comprise a charge storage device configured to be one of charged and discharged when said clock signal is one of present and absent.

The charge storage device may be configured to be the other of charged and discharged when the clock signal is the other of present and absent.

The charge storage device may comprise at least one capacitor.

The detection circuitry may be configured to provide said control signal and to change from one of said first level and said second level to the other of said first level and said second level a given time after the input has changed.

The detection circuit may comprise a threshold detecting circuit configured to provide said control signal, said threshold detecting circuit configured to provide said control signal having said second level if said clock signal is absent.

The threshold detecting circuit may be configured to provide said control signal having said first level if said clock signal is present.

The threshold detecting circuit may comprise a Schmitt trigger.

According to another embodiment, there is provided a circuit comprising: a first circuit and a second circuit, said first circuit comprising an input configured to receive a clock signal, detection circuitry configured to detect if said clock signal is present on said input, and an output configured to provide a control signal in dependence on if said clock signal is present on said input, and said second circuit having an input to receive said control signal and functional circuitry, said functional circuitry being configured to enter a standby mode when said control signal is indicative of an absence of said clock signal on the first circuit input.

The functional circuitry may be configured to enter an active mode when said control signal is indicative of a presence of said clock signal.

The second circuit may comprise power on reset circuitry configured to control said functional circuitry to be in said active or standby mode, responsive to said control signal.

The functional circuitry may comprise at least one of input/out circuitry and core circuitry.

According to another aspect, there is provided an integrated circuit comprising: a first circuit and a second circuit, said first circuit comprising an input configured to receive a clock signal, detection circuitry configured to detect if said clock signal is present on said input, and an output configured to provide a control signal in dependence on if said clock signal is present on said input, and said second circuit having an input to receive said control signal and functional circuitry, said functional circuitry being configured to enter a standby mode when said control signal is indicative of an absence of said clock signal on the first circuit input.

The integrated circuit may comprise a clock input pad, said first circuit being provided adjacent said clock input pad.

According to another aspect, there is provided a circuit comprising: input means for receiving a clock signal; detection means for detecting if said clock signal is present on said input; and output means for providing a control signal having a first level if said clock signal is present on said input and a second level if said clock signal is absent from said input.

According to another embodiment, there is provided a method comprising: detecting if a clock signal is present on an input; and providing a control signal having a first level if said clock signal is present on said input and a second level if said clock signal is absent from said input.

The method may comprise using said control signal to cause functional circuitry to enter a standby mode when said control signal is indicative of an absence of said clock signal on the input.

BRIEF DESCRIPTION OF THE DRAWINGS

Reference will be made by way of example only to the accompanying drawings in which.

DETAILED DESCRIPTION

Figure 1:
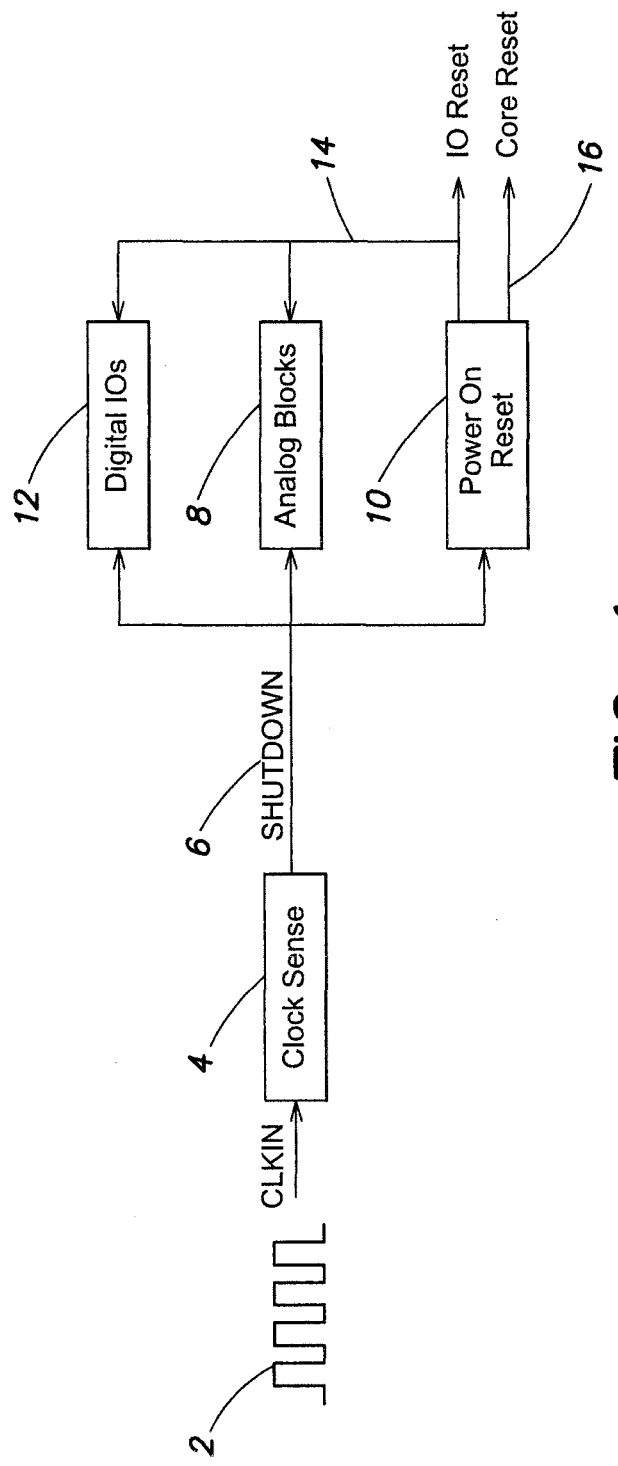
FIG. 1 schematically shows a part of an integrated circuit according to an embodiment.

Reference is made to FIG. 1 which schematically shows part of an integrated circuit according to an embodiment. When an integrated circuit is active and functional, the integrated circuit or at least part of the integrated circuit will utilize power to provide the desired function. In the arrangement shown in FIG. 1, when the particular functional feature is not required, a part or whole of the integrated circuit can be moved to a stand-by mode.

The standby mode is a low power mode. When in the standby mode the IC will be inactive or will have a low level of activity. Generally in the standby mode, voltage is applied to at least part of the integrated circuit and there may be little or no activity in that part of the integrated circuit. In some embodiments, the voltage which is applied to some parts of the IC may be switched off or reduced compared to the normal active mode voltage. In one embodiment, the hardware standby mode is defined as state when all supplies are present, while there is no activity in chip/circuit.

Generally, digital systems are synchronous in nature and thus require an external clock for operation. In some embodiments, the standby mode is activated by sensing the status of clock signal on clock input pad.

In some integrated circuits, an input/output ring is provided which may have a number of different functional blocks. For example, some of these blocks may be analog blocks. Analog blocks may be provided in a core of the integrated circuit. By way of example only, these analog blocks may comprise one or more of: band gap blocks; compensation blocks; opamp blocks, supply comparator blocks, PLL (phase lock loop) blocks or the like. Some of these blocks may be current biased. This means that when those blocks are idle, they continue to consume a relatively large amount of current.

In the embodiment shown in FIG. 1, an arrangement is provided where the analog and/or digital blocks are put into a standby state, to reduce power consumption. In the arrangement shown in FIG. 1, the stand-by state is sensed by determining an absence of a clock. When clock activity is again detected, these analog and/or digital blocks can be activated and thus the integrated circuit starts operating again.

FIG. 1 shows a schematic of an integrated circuit in accordance with an embodiment. The presence or absence of an external clock is detected by a clock sense module 4, which is placed inside the chip. The sense module 4 may be provided in the input/output ring or core of the integrated circuit. The clock sense module 4 tracks the clock status on the clock pad and gives clock status information though its output 6, called SHUTDOWN. When no clock signal 2 CLKIN is detected by the sense module, the clock send module triggers an output where SHUTDOWN=0. The integrated circuit is moved to a standby mode and the analog blocks are switched off resulting in reduction of power consumption.

When a clock signal is detected, the clock sense module triggers an output where SHUTDOWN=1. This causes the integrated circuit to switch on, resulting in restoration of all functionalities.

Thus in FIG. 1, the clock signal 2 is input to the clock sense module 4. The clock sense module has an input to receive the clock signal. The clock sense module 4 is configured to detect the presence or absence of this clock signal. When the clock sense circuitry 4 detects an absence of the clock signal, this clock sense circuit 4 provides a control signal 6 to analog blocks 8 of the integrated circuit. The clock sense circuit has an output to provide this control signal. This control signal may be a shut down signal. This control signal 6 is also provided to a power-on reset block 10 and digital input/output blocks 12. This causes the integrated circuit or at least part of the integrated circuit to enter the standby mode.

The power-on reset block 10 provides an output 14 which is an input/output IO reset signal. This IO reset signal 14 is provided to the analog blocks 8 and the digital IO blocks 12. The power-on reset block 10 is also arranged to provide a core reset signal 16 which is used by the core of the integrated circuit. In general terms, the IO reset 14 provided by the power-on reset block 10 is provided in response to the clock signal being detected after the analog blocks have been put into the stand-by states and is used to reset the analog blocks 8, the digital IOs blocks 12 and the core.

In one embodiment, the clock sense module may sense activity based on the detection of external clock signals. For example, in the presence of external clocking signals, the clock sense module may generate a response signal to operate the integrated circuit to switch on the digital IOs, analog blocks, and/or core etc. In the absence of external clocking signals, the clock sense module may generate a signal to move the integrated circuit to a standby mode and switch off some or all the digital IOs, analog blocks, and/or core etc.

Figure 2:
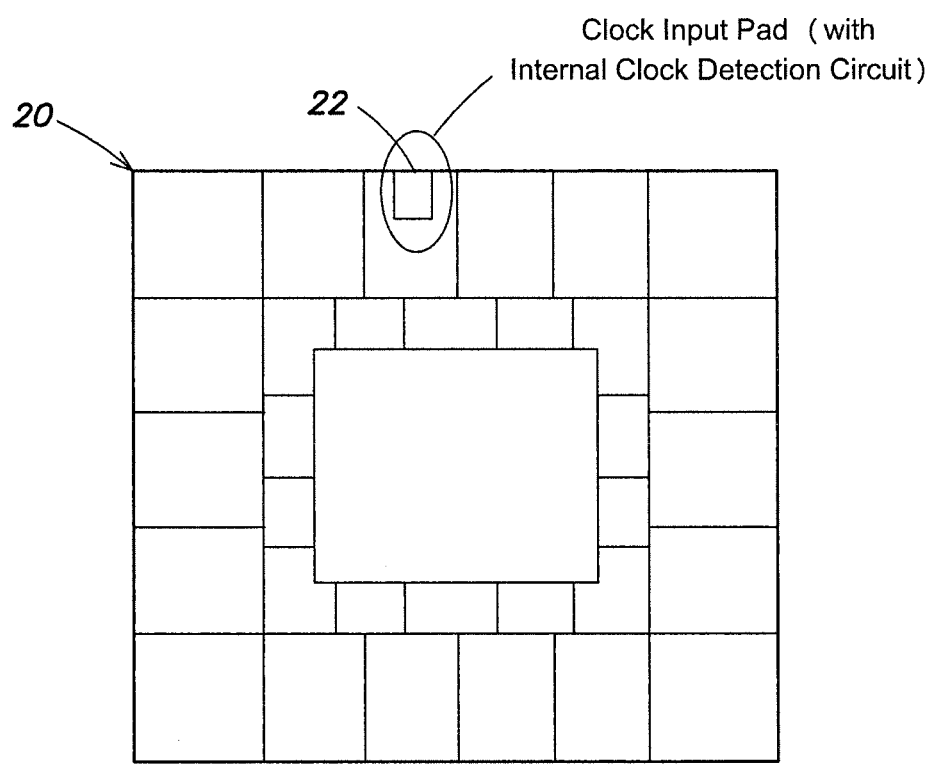
FIG. 2 schematically shows the location of part of the arrangement of FIG. 1 in an integrated circuit.

Reference is made to FIG. 2 which shows an integrated circuit 20 in which the arrangement of FIG. 1 may be incorporated. The integrated circuit 20 has a clock input pad 22 which is configured to receive the clock signal 2. The clock input pad is configured to incorporate the clock sense circuitry 4 of FIG. 1.

In embodiments, an automatic clock detection based methodology may be used. When the clock signal 2 is present on the clock input pad the integrated circuit moves to a functional state. However, when no clock 2 is provided on the clock input pad 22, the integrated circuit goes to a stand-by mode in which power consumption is reduced.

Some embodiments may have the advantage that no dedicated pad is required for a signal to drive the integrated circuit into the stand-by mode. In the described embodiments, the detection of the absence of the clock on the input pad is used to put the integrated circuit into a stand-by mode.

The presence of the clock signal is used to put the integrated circuit to a functional mode. This may be done automatically.

In the embodiment shown in FIG. 2, the clock signal is shown as being generated externally of the chip. The clock sense module may be used on system on chips (SoCs) and other circuits. The clock sense circuitry may be provided in the core or the IO area of the integrated circuit or in any other suitable location. Some embodiments may be provided off chip. Some embodiments may be used to control two or more integrated circuits.

Figure 3:
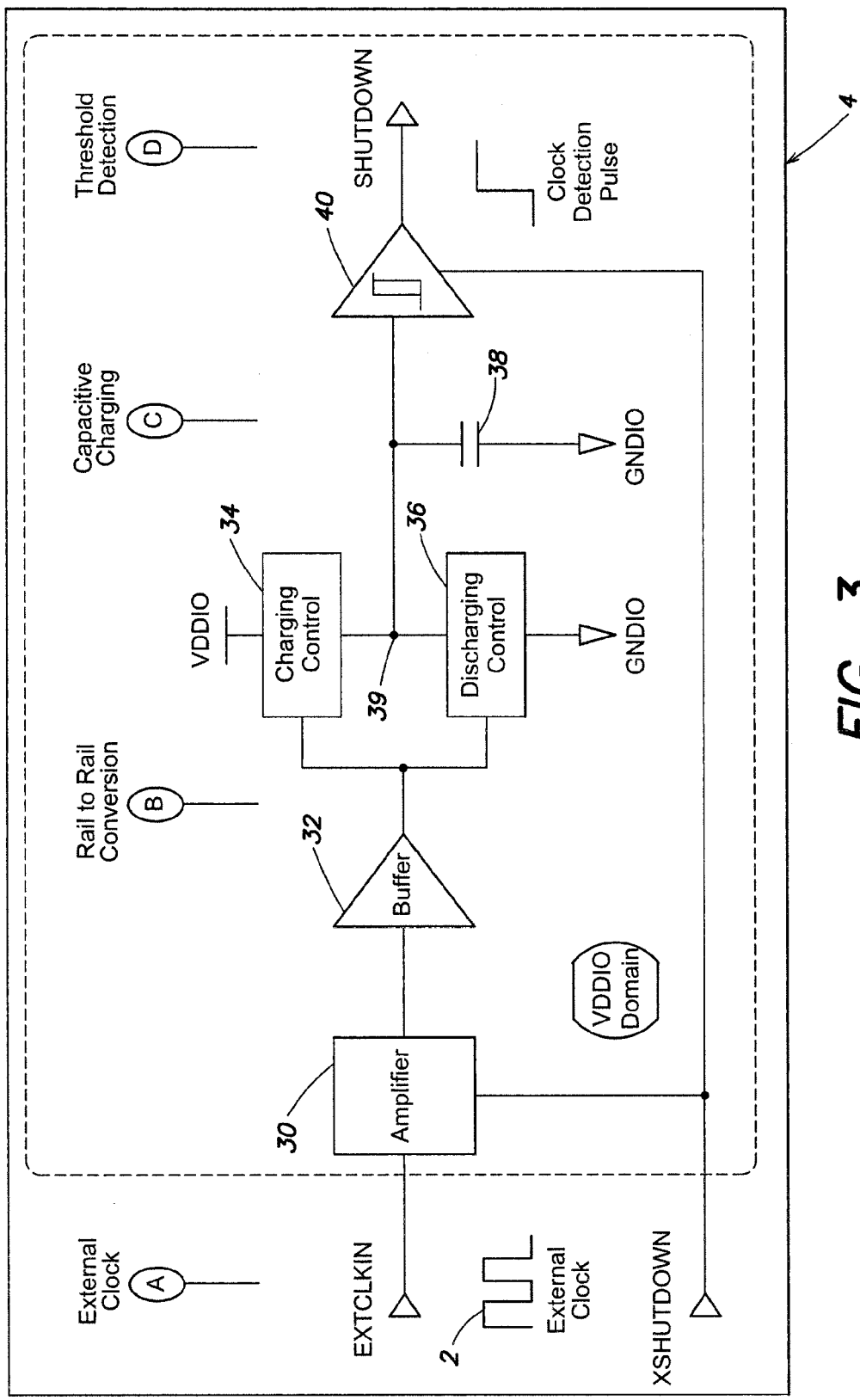
FIG. 3 shows the clock sense circuitry of FIG. 1 in more detail.

Reference is made to FIG. 3 which shows the clock sense module 4 in more detail. The clock sense circuitry is configured to provide a first signal at a first level indicating the absence of a clock signal and a second signal at a second different level indicating the presence of a clock signal. The first level may be a "1" level and the second level may be a "0" level or vice versa. The first and second signals may be provided from the same output or may be provided by different outputs.

The clock sense module uses the filtered version of the external clock to define a hardware standby mode wherein the power consumption is reduced by powering down consuming blocks.

When the first signal is at the first level, this will cause the at least one power consuming block to be turned off. The block(s) may be an analog block(s) and/or digital block(s). The block(s) may be in the core and/or the input/output area. When the second signal is at the second level, the block(s) are turned on.

The clock sensing circuit uses the input/output supply voltage Vddio. In one alternative, a separate voltage supply is used to drive the clock sense circuit.

Figure 5:
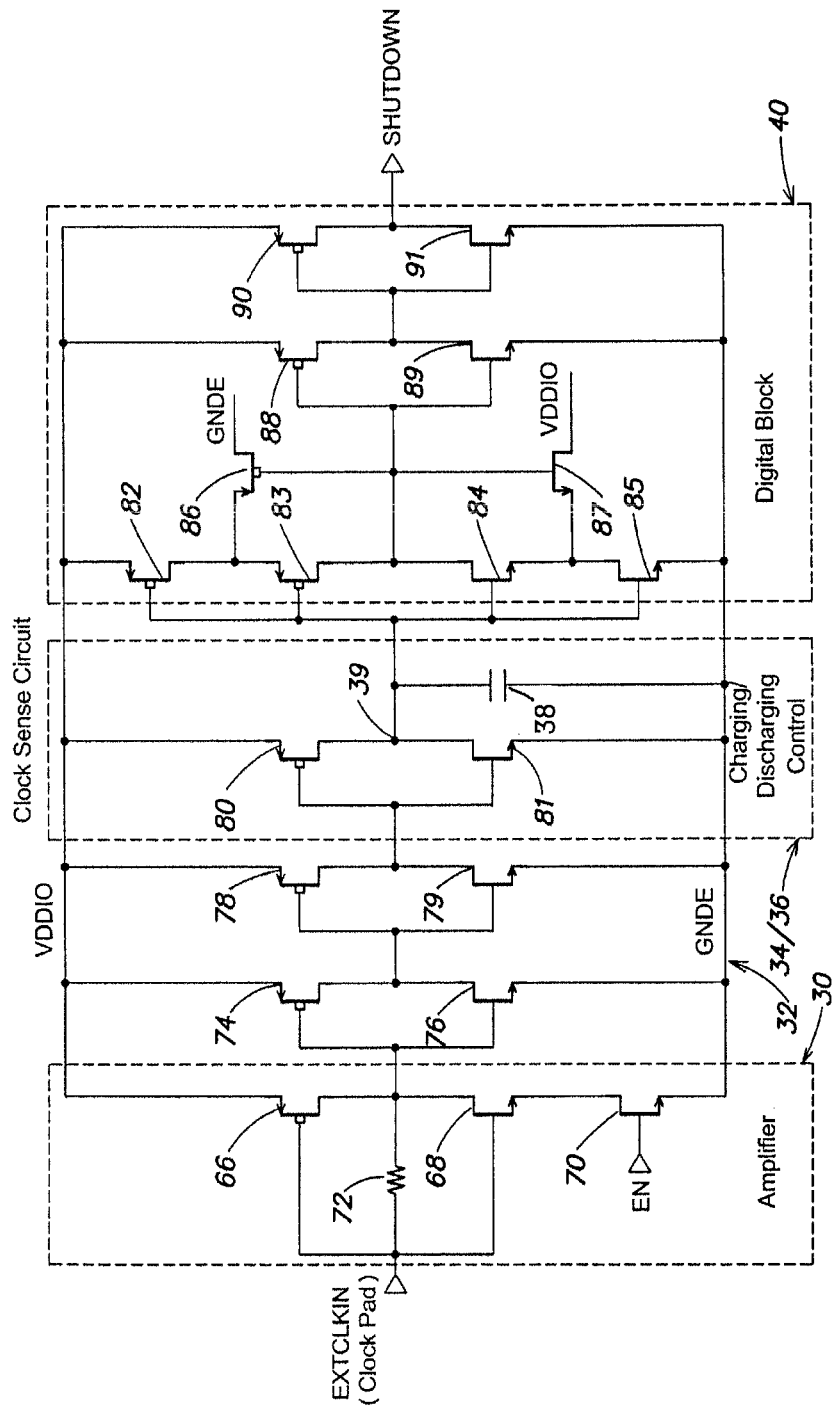
FIG. 5 shows an example of the clock sense circuitry at a transistor level.

The clock sense module 4 is based on the clock input signal, static power consumption, and off-on time (time in which clock sensor output) requirements. The clock sense module has three sub-blocks, an amplifier, an integrator and a digital block. Thus the clock sensing module 4 comprises an amplifier 30. The amplifier 30 is configured to receive the clock signal 2. The amplifier will amplify the received clock signal if present. The amplifier 30 has an output connected or coupled to the input of a buffer 32. As shown in FIG. 5, the amplifier is an inverter-based amplifier. The amplifier comprises in series between Vddio and ground, a first transistor 66, a second transistor 68 and a third transistor 70. The first and second transistors provide an inverter with the input and output shorted via a resistor 72. In particular, the gates of the first and second transistors receive the clock signal as does one side of the resistor 72. The other side of the resistor is connected or coupled to a node between the first and second transistors which provides the output of the amplifier. The gate of the third transistor 70 receives an enable signal. It should be appreciated that this is one example of a possible construction of the amplifier. The arrangement of the amplifier of FIG. 5 may consume a relatively very low current (<10 uA), but may provide dc voltage for sine wave clock inputs when fed via, for example, a 100 nF capacitor.

As can be seen from FIG. 5, the buffer comprises fourth 74 and fifth 76 transistors arranged in series between Vddio and ground. In parallel are arranged sixth 74 and seventh 76 transistors, in series between Vddio and ground. The gates of the fourth and fifth transistors are coupled to the node between the first and second transistors and the gates of the sixth and seventh transistors are coupled to a node between the fourth and fifth transistors. The fourth and fifth transistors form an inverter as do the sixth and seventh transistors.

The buffer 32 is connected or coupled to a charging control circuit 34 and a discharging control circuit 36. The charging control circuit 34 is connected or coupled to the voltage supply Vddio while the discharging control circuit 36 is connected or coupled to ground. The output of the charging control circuit 34 and the discharging control circuit 36 is connected or coupled to a common node 39 which is connected or coupled to a capacitor 38. The capacitor 38 is arranged between node 39 and ground. As can be seen from FIG. 5 the charging-discharging control circuit 34-36 comprises eighth 80 and ninth 81 transistors arranged in series between Vddio and ground with the gates coupled to a node between the sixth and seventh transistors. Node 39 is provided between the eighth and ninth transistors. Again the eighth and ninth transistors form an inverter. The amplified clocked signal is thus fed to charging-discharging control circuit 34-36 which provides an integrator (RC charging and discharging circuit). This converts the toggling input clock to a low frequency output to trigger the output to HIGH. When there is no clock, the amplifier output is pulled LOW and the RC circuit discharges the output node of integrator to 0. The integrator charging-discharging control circuit block, thus derives the on-off time of clock sensor.

Node 39 is also connected or coupled to a Schmitt trigger 40. The output of the Schmitt trigger 40 provides a clock detection pulse. This clock detection pulse provides the first and second signals. As can be seen in FIG. 5, the Schmitt trigger comprises tenth to thirteenth transistors 82-85 arranged in series between Vddio and ground with the gates of each of these transistors coupled to node 39.

A fourteenth transistor 86 is arranged between a node between the tenth and eleventh transistors and ground. A fifteenth transistor 87 is arranged between a node between the twelfth and thirteenth transistor and Vddio. The gates of the fourteenth and fifteenth transistors are coupled to a node between the eleventh and twelfth transistors.

Sixteenth and seventeenth transistors 88 and 89 are arranged in series between Vddio and ground with the gates of each of these transistors coupled to the node between the eleventh and twelfth transistors. Eighteenth and nineteenth transistors 90 and 91 are arranged in series between Vddio and ground with the gates of each of these transistors coupled to the node between the sixteenth and seventeenth transistors.

The output of charging-discharging control circuit is passed on to the Schmitt trigger, to quantize and provide driving capability to SHUTDOWN output. This part of the circuit comprises a Schmitt trigger and inverter chain to drive load.

Some embodiments may also have an option of asynchronous standby control using pad XSHUTDOWN. Thus a shutdown signal may be forced into the IC to cause the standby mode.

It should be appreciated that in one embodiment, the first, fourth, sixth, eighth, tenth, eleventh, fourteenth, sixteenth and eighteenth transistors are PMOS transistors whilst the remaining transistors are NMOS. Of course this is by way of example only and different transistor arrangements and/or different types of transistors may be used in alternative embodiments.

Figure 4:
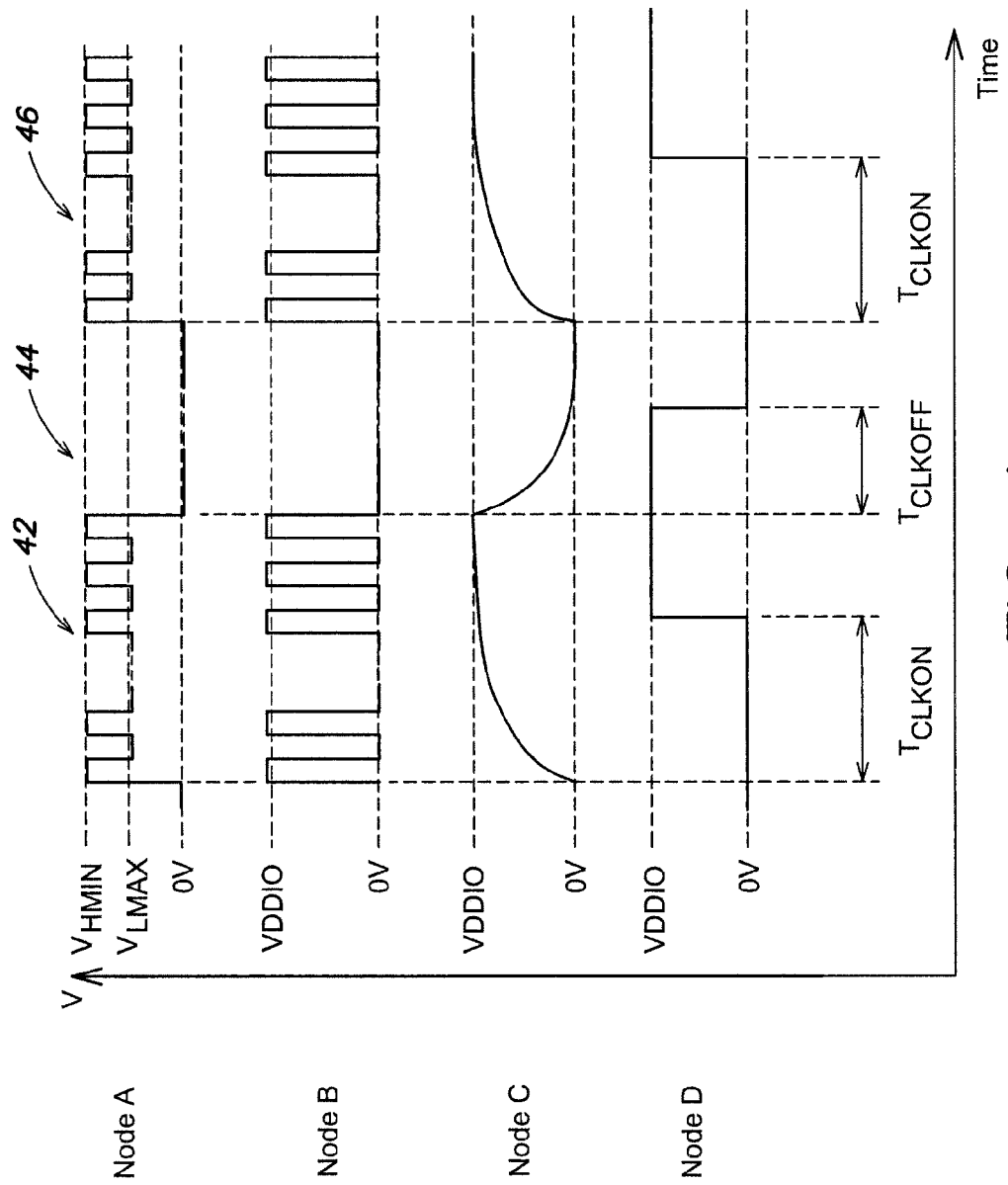
FIG. 4 shows timing graphs for the clock sense circuitry of FIG. 3.

FIG. 3 will be described in relation to FIG. 4 which shows the signals at various nodes in the circuit of FIG. 3. Initially, a clock signal is input to the amplifier 30. The clock signal at node A, at the input to the amplifier 30, is shown in FIG. 4. The clock signal is shown as having a first time period 42 where the clock signal is active. This is followed by a second time period 44 in which the clock signal is not active. This in turn is followed by a third time period 46 in which the clock signal is again active. In the arrangement shown in FIG. 4, the clock signal is shown as varying between two voltages, both of which are greater than 0. It should be appreciated that this is by way of example only and any other suitable clock signal may be provided in other embodiments. During the time period 44 during which the clock signal is not provided, there is no input, that is the input is at 0 Volts indicating that no clock signal is present.

The clock signal is amplified by the amplifier 30 and buffered by the buffer 32. The output of buffer 32 is node B. As can be seen from FIG. 4, the signal at node B, for the first and third time periods 42 and 46, is an amplified version of the input clock signal. The frequency is generally the same as at node A but the amplitude of the signal is much bigger. Additionally, the signal varies between 0 volts to Vddio. In the second period, the clock signal is again flat at 0 volts.

The output of the buffer 32 is connected or coupled to the charging control circuit—discharging control circuit 34-36. For the first and third time periods 42 and 46, the charging control circuit—discharging control circuit 34-36 will detect the presence of a clock signal and effectively cause the capacitor 38 to be connected or coupled to Vddio to thereby charge the capacitor 38. In contrast, for the second time period, the charging control circuit—discharging control circuit 34-36 is configured to couple the capacitor 38 to ground, thus causing the capacitor to discharge. With reference to FIG. 4, node C shows the voltage at node 39. Thus, in the first period 42, the capacitor is charged up to a maximum voltage. However, in the second period 44, the capacitor is discharged due to the fact that there is no clock signal present. Finally, in the third time period 46, the capacitor once again is charged up due to the presence of the clock signal.

The capacitor 38 thus controls the voltage on node 39 which provides an input to the Schmitt trigger 40. The output of the Schmitt trigger 40 is provided at node D. The Schmitt trigger will be triggered when the voltage at node 39 is higher than a given threshold. Generally, in the arrangement shown in FIG. 3, the Schmitt trigger 40 is triggered when the voltage on node 39 is generally equal to Vddio. The output of the Schmitt trigger 40 will remain high until the voltage at node 39 falls below a lower threshold. In the arrangement shown in FIGS. 3 and 4, the lower threshold is 0 volts. Thus, as can be seen from FIG. 4, the Schmitt trigger initially provides a low level output during the first period until the voltage at node 39 reaches Vddio. At that point, the output of the Schmitt trigger 40 goes high (providing the second signal). The output of the Schmitt trigger 40 remains high for part of the second period 44 until the voltage at node 39 has fallen to 0V. At that point, the output of the Schmitt trigger goes to 0 (the first signal). Likewise, the output of the Schmitt trigger 40 is initially low in the third time period 46 until the voltage on node 39 has risen to Vddio.

It should of course be appreciated that any other suitable threshold detecting circuitry can be used instead of the Schmitt trigger 40 shown. Likewise, the thresholds for triggering the Schmitt trigger can of course be different to those voltages discussed in relation to FIGS. 3 and 4.

The clock sense block may always operational (even in standby mode. It is preferable that it consumes low power.

Figure 6:
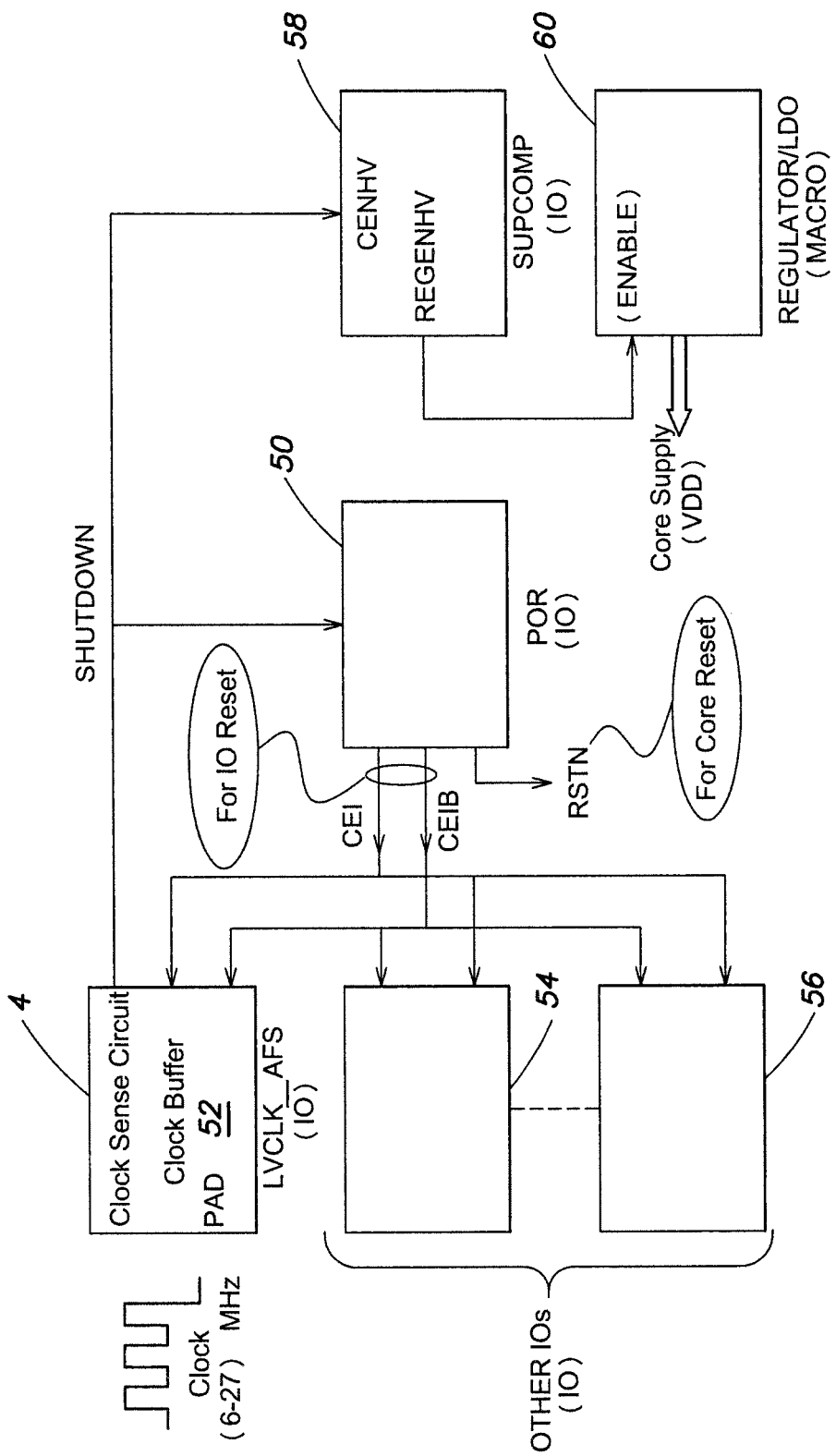
FIG. 6 shows a more detailed scenario in which embodiments may be used.

An arrangement in which some embodiments may be used will now be described with reference to FIG. 6. The integrated circuit comprises the clock sense circuit 4 as for example shown in FIG. 3. The clock sense circuit is configured to provide the clock detection pulse which is used as a standby mode or power up signal. This signal is provided to power-on reset circuitry 50. The power-on reset circuitry 50 is connected or coupled to a clock buffer 52 and a plurality of other input/output devices. The clock buffer passes the clock to the core By way of example, two input/output devices 54 and 56 are shown. The power-on reset circuit provides a first output (chip enable) CEI and a second output CEIB (chip enable bar—the inverse of the chip enable signal) which are both provided to the clock buffer 52 and a plurality of input/output circuits 54 and 56. CEI and CEIB are used for resetting the input and output devices 52, 54 and the clock buffer 56 on power up.

The power on reset circuit 50 also provides a reset signal for the core. The power-on reset circuit 50 will be arranged to provide a power-on reset output when the clock signal is reapplied after having been absent.

The output of the clock sense circuit 4 is provided to a control block 58. This block is an input/output block 58 and provides a control output to a voltage regulator block 60. The voltage regulator block 60 is arranged to control the voltage supply VDD to the core of the integrated circuit. This voltage regulator block 60 will be controlled to switch off the voltage supply to the core when the clock sense circuit 4 detects that there is no clock signal present and will cause the regulator to provide the voltage to the core when the clock signal is detected.

In some embodiments, the power on reset circuitry may be omitted. Functional circuitry may be put into a stand-by mode using any other suitable circuitry. By way of example only, a logic gate arrangement may be used in some embodiments.

In some embodiments, power on reset circuitry may be present but alternative suitable circuitry may be used to put functional circuitry into the stand-by mode. That alternative circuitry may be a logic gate arrangement.

It should be appreciated that other detection circuitry configured to detect if a clock signal is present may be used in embodiments instead of the clock sense modules described above.

The clock sense module or other detection circuitry may be configured to provide a control signal having a first level if the clock signal is present and/or a second level if the clock signal is absent. The first level may be "1" and the second level may be "0" or vice versa.

In some embodiments, may use any suitable charge storing device instead of or in addition to the capacitor. In some embodiments more than one capacitor may be used.

In some embodiments, the clock sense module or other detection circuitry may be configured to cause functional circuitry to enter a standby mode. The functional circuitry can be any suitable circuitry. By way of example only, the functional circuitry may be a core, input/output blocks, analog blocks, digital blocks and/or any other suitable circuitry.

Some embodiments may be used in integrated circuits, in one or more dies, or outside an integrated circuit.

Figure 7:
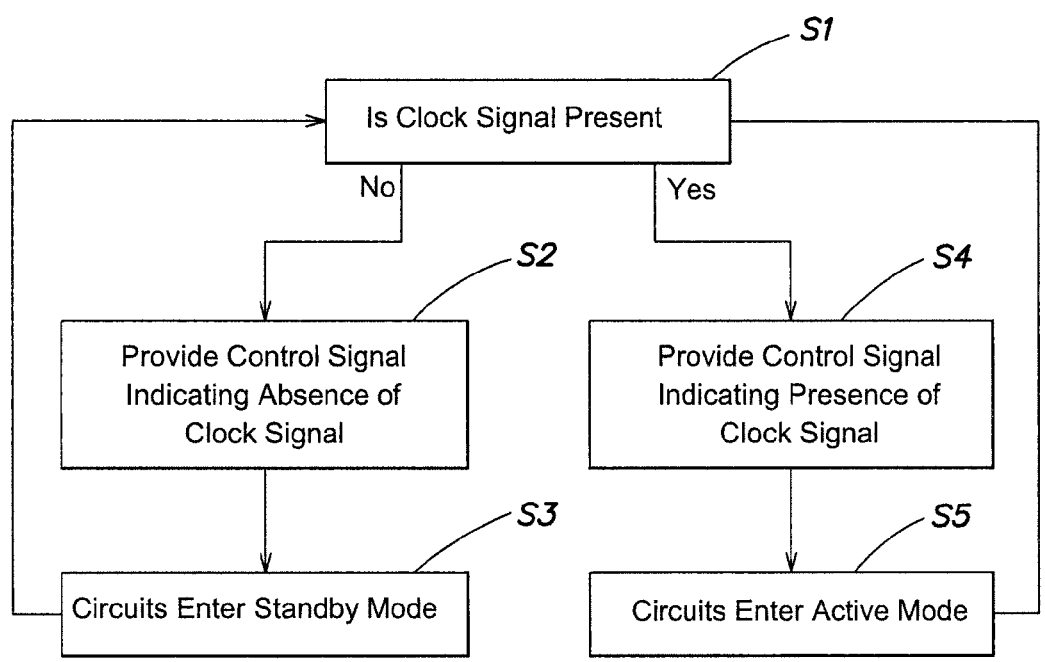
FIG. 7 shows a method.

Reference is made to FIG. 7 which shows a method. In step S1, a determination is made as to whether a clock signal is present or not.

In step S2, if the clock signal is not present, then a control signal indicative of the absence of the clock signal is provided.

In step S3, one or more circuits enter the stand-by mode responsive to the control signal.

The method will then loop back to step S1.

If the clock signal is present, then the next step will be step S4. The control signal will be indicative of the presence of the clock signal.

This is followed by step S5 in which one or more circuits are in an active mode. If the circuits were in a stand-by mode they are reactivated responsive to the control signal.

Again the method will loop back to step S1.

It should be appreciated that any one or more of the steps may be omitted and/or replace by one or more steps. In some embodiments, one or more steps may be modified, for example as described in relation to other of the embodiments.

Embodiments of the invention may be incorporated in any suitable device whether power by a mains supply or a battery. By way of example only, some embodiments may be used in mobile phones, smart phones, user equipment, portable computers, laptops, net books, tablets, televisions, set top boxes, media devices, DVD devices, or the like.

Whilst this detailed description has set forth some embodiments of the present invention, the appended claims cover other embodiments of the present application which may differ from the described embodiments according to various modifications and improvements. Other applications and configurations may be apparent to the person skilled in the art.

What is claimed is:

1. A circuit comprising:
an input configured to receive a clock signal;
detection circuitry configured to detect whether said clock signal is present on said input;
an output configured to provide a control signal having a first level if said clock signal is present on said input and a second level if said clock signal is absent from said input; and
power on reset circuitry configured to control functional circuitry to be in an active mode or a standby mode, responsive to said control signal,
wherein said detection circuitry includes an inverter, and
wherein an input and an output of the inverter are coupled.

2. A circuit as claimed in claim 1, wherein said detection circuitry comprises an amplifier configured to amplify a signal on said input, and wherein said amplifier includes said inverter.

3. A circuit as claimed in claim 1, wherein said detection circuitry comprises a charge storage device configured to be charged when said clock signal is present.

4. A circuit as claimed in claim 3, wherein said charge storage device is configured to be discharged when the clock signal is absent.

5. A circuit as claimed in claim 3, wherein said charge storage device comprises at least one capacitor.

6. A circuit as claimed in claim 1, wherein said detection circuitry is configured to: provide said control signal and to change said control signal from said second level to said first level a predetermined time after a clock signal is applied to the input.

7. A circuit as claimed in claim 1, wherein said detection circuitry comprises threshold detecting circuitry configured to provide said control signal, said threshold detecting circuitry configured to provide said control signal having said second level if said clock signal is absent.

8. A circuit as claimed in claim 7, wherein said threshold detecting circuitry is configured to provide said control signal having said first level if said clock signal is present.

9. A circuit as claimed in claim 7, wherein said threshold detecting circuitry comprises a Schmitt trigger.

10. A device comprising:
a first circuit and a second circuit,
said first circuit comprising an input configured to receive a clock signal, detection circuitry configured to detect whether said clock signal is present on said input, and an output configured to provide a control signal indicative of whether said clock signal is present on said input, and
said second circuit comprising an input to receive said control signal and functional circuitry, said functional circuitry being configured to enter a standby mode when said control signal is indicative of an absence of said clock signal on the first circuit input,
wherein said second circuit further comprises power on reset circuitry configured to control said functional circuitry to be in an active mode or said standby mode, responsive to said control signal, and
wherein said detection circuitry includes an inverter, and wherein an input and an output of the inverter are coupled.

11. A device as claimed in claim 10, wherein said functional circuitry is configured to enter the active mode when said control signal is indicative of a presence of said clock signal.

12. A device as claimed in claim 10, wherein said functional circuitry comprises input/output circuitry, analog circuitry, digital circuitry, and/or core circuitry.

13. An integrated circuit comprising:
a first circuit and a second circuit,
said first circuit comprising an input configured to receive a clock signal, detection circuitry configured to detect whether said clock signal is present on said input, and an output configured to provide a control signal indicative of whether said clock signal is present on said input, and
said second circuit comprising an input to receive said control signal and functional circuitry, said functional circuitry being configured to enter a standby mode when said control signal is indicative of an absence of said clock signal on the first circuit input,
wherein said second circuit further comprises power on reset circuitry configured to control said functional circuitry to be in an active mode or said standby mode, responsive to said control signal, and
wherein said detection circuitry includes an inverter, and wherein an input and an output of the inverter are coupled.

14. An integrated circuit as claimed in claim 13, comprising a clock input pad, said first circuit being provided adjacent said clock input pad.

15. A circuit comprising:
an input configured to receive a clock signal;
a detection circuit configured to detect whether said clock signal is present on said input;
an output configured to provide a control signal having a first level if said clock signal is present on said input and a second level if said clock signal is absent from said input; and
power on reset means for controlling functional circuitry to be in an active mode or a standby mode, responsive to said control signal,
wherein said detection circuitry includes an inverter, and wherein an input and an output of the inverter are coupled.

16. A method comprising:
detecting, with detection circuitry, whether a clock signal is present on an input, wherein said detection circuitry includes an inverter, and wherein an input and an output of the inverter are coupled;
providing, to power on reset circuitry, a control signal having a first level if said clock signal is present on said input and a second level if said clock signal is absent from said input; and
with the power on reset circuitry, controlling functional circuitry to be in an active mode or a standby mode, responsive to the control signal.

17. A method as claimed in claim 16, wherein controlling the functional circuitry to be in the active mode comprises the power on reset circuitry providing a reset signal to the functional circuitry if the clock signal is detected.

18. The circuit of claim 2, wherein: an amplitude of the amplified signal varies from zero volts to an input/output supply voltage.

19. The circuit of claim 1, wherein the power on reset circuitry is configured to control the functional circuitry by providing a reset signal if the clock signal is detected, and wherein the reset signal is for resetting at least a portion of the functional circuitry from the standby mode to the active mode.

20. The circuit of claim 19, wherein a voltage provided to at least the portion of the functional circuitry in the standby mode is lower than a voltage provided to at least the portion of the functional circuitry in the active mode.

21. The circuit of claim 19, wherein at least the portion of the functional circuitry is switched off in the standby mode.

22. The circuit of claim 21, wherein the reset signal is for resetting at least the portion of the functional circuitry from the standby mode to the active mode during power up.

23. The circuit of claim 21, wherein at least the portion of the functional circuitry comprises input/output circuitry, core circuitry, analog circuitry, and/or digital circuitry.

24. The circuit of claim 21, wherein at least the portion of the functional circuitry comprises current-biased circuitry.

25. The circuit of claim 24, wherein the current-biased circuitry comprises a band gap block, a compensation block, an opamp block, a supply comparator block, and/or a phase locked loop block.

26. The device of claim 10, wherein the functional circuitry is configured to enter the standby mode when said control signal is indicative of an absence of said clock signal.

27. The device of claim 10, wherein:
the power on reset circuitry is configured to control said functional circuitry by providing a reset signal if the clock signal is detected, and
at least a portion of the functional circuitry is configured to reset from the standby mode to the active mode in response to the reset signal.

28. The device of claim 27, wherein a voltage provided to at least the portion of the functional circuitry in the standby mode is lower than a voltage provided to at least the portion of the functional circuitry in the active mode.

29. The device of claim 27, wherein at least the portion of the functional circuitry is switched off in the standby mode.

30. The device of claim 29, wherein at least the portion of the functional circuitry comprises input/output circuitry, core circuitry, analog circuitry, and/or digital circuitry.

31. The device of claim 29, wherein at least the portion of the functional circuitry comprises current-biased circuitry.

32. The device of claim 31, wherein the current-biased circuitry comprises a band gap block, a compensation block, an opamp block, a supply comparator block, and/or a phase locked loop block.

33. The integrated circuit of claim 13, wherein:
the power on reset circuitry is configured to control said functional circuitry by providing a reset signal if the clock signal is detected, and
at least a portion of the functional circuitry is configured to reset from the standby mode to the active mode in response to the reset signal.

34. The circuit of claim 33, wherein a voltage provided to at least the portion of the functional circuitry in the standby mode is lower than a voltage provided to at least the portion of the functional circuitry in the active mode.

35. The circuit of claim 33, wherein at least the portion of the functional circuitry is switched off in the standby mode.

36. The circuit of claim 35, wherein at least the portion of the functional circuitry comprises input/output circuitry, core circuitry, analog circuitry, and/or digital circuitry.

37. The circuit of claim 35, wherein at least the portion of the functional circuitry comprises current-biased circuitry.

38. The circuit of claim 37, wherein the current-biased circuitry comprises a band gap block, a compensation block, an opamp block, a supply comparator block, and/or a phase locked loop block.

* * * * *